US006903606B1

(12) United States Patent
Yan et al.

(10) Patent No.: US 6,903,606 B1
(45) Date of Patent: Jun. 7, 2005

(54) DC OFFSET CORRECTION USING UNUSED LNA

(75) Inventors: Kelvin Kai Tuan Yan, Oak Ridge, NC (US); Alexander Wayne Hietala, Phoenix, AZ (US); John Crago, Walkertown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 45 days.

(21) Appl. No.: 10/647,775

(22) Filed: Aug. 25, 2003

(51) Int. Cl.[7] .............................. H03F 1/02; H04B 1/10
(52) U.S. Cl. ............................. 330/9; 330/51; 455/283; 455/296
(58) Field of Search .................. 330/2, 9, 51; 327/307; 455/283, 296

(56) References Cited

U.S. PATENT DOCUMENTS

| | | | |
|---|---|---|---|
| 5,608,353 A | 3/1997 | Pratt | 330/295 |
| 5,629,648 A | 5/1997 | Pratt | 330/289 |
| 6,130,579 A | 10/2000 | Iyer et al. | 330/285 |
| 6,191,656 B1 | 2/2001 | Nadler | 330/288 |
| 6,229,395 B1 | 5/2001 | Kay | 330/252 |
| 6,265,943 B1 | 7/2001 | Dening et al. | 330/296 |
| 6,271,727 B1 | 8/2001 | Schmukler | 330/284 |
| 6,285,239 B1 | 9/2001 | Iyer et al. | 327/531 |
| 6,307,364 B1 | 10/2001 | Augustine | 324/95 |
| 6,313,705 B1 | 11/2001 | Dening et al. | 330/276 |
| 6,316,992 B1 * | 11/2001 | Miao et al. | 330/9 |
| 6,329,809 B1 | 12/2001 | Dening et al. | 324/95 |
| 6,333,677 B1 | 12/2001 | Dening | 330/296 |
| 6,356,150 B1 | 3/2002 | Spears et al. | 330/145 |
| 6,369,656 B2 | 4/2002 | Dening et al. | 330/296 |
| 6,369,657 B2 | 4/2002 | Dening et al. | 330/296 |
| 6,392,487 B1 | 5/2002 | Alexanian | 330/254 |
| 6,404,287 B2 | 6/2002 | Dening et al. | 330/296 |
| 6,498,929 B1 * | 12/2002 | Tsurumi et al. | 455/296 |
| 6,525,611 B1 | 2/2003 | Dening et al. | 330/298 |
| 6,528,983 B1 | 3/2003 | Augustine | 324/95 |
| 6,566,963 B1 | 5/2003 | Yan et al. | 330/311 |
| 6,624,702 B1 | 9/2003 | Dening | 330/297 |
| 6,639,460 B1 * | 10/2003 | Botker | 330/9 |
| 6,816,718 B2 * | 11/2004 | Yan et al. | 455/317 |

OTHER PUBLICATIONS

Razavi, Behzad, "Design Considerations for Direct–Conversion Receivers," IEEE Transactions on Circuits and Systems—II: Analog and Digital Signal Processing, vol. 44, No. 6, Jun. 1997, pp. 428–435.

* cited by examiner

Primary Examiner—Khanh V. Nguyen
(74) Attorney, Agent, or Firm—Withrow & Terranova, PLLC

(57) ABSTRACT

A receiver performs DC offset correction by preliminarily using an unused LNA with a terminating resistance to determine a base level DC offset. Once the DC offset is determined, a DC offset correction may be calculated and applied to an active LNA output. When determining the DC offset, the active LNA is disabled.

25 Claims, 2 Drawing Sheets

DC OFFSET CORRECTION USING UNUSED LNA

FIELD OF THE INVENTION

Figure 1:
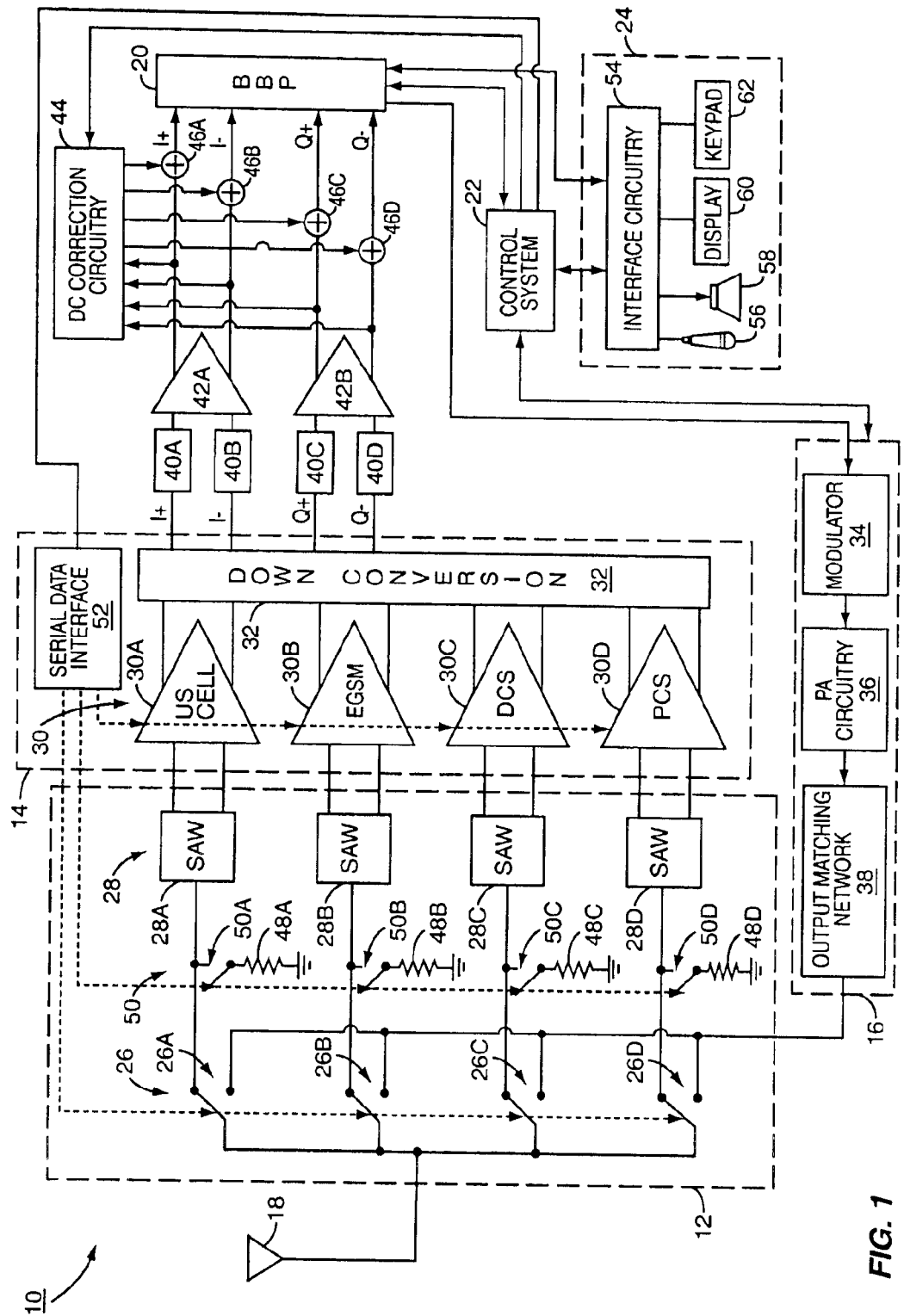

The present invention relates to DC offset correction, and in particular, to providing a DC offset from which a DC offset correction can be calculated in multiple mode or multiple band mobile terminals and the like.

BACKGROUND OF THE INVENTION

Wireless communication systems support various access technologies, each of which can take numerous forms and be implemented in different frequency bands. For example, the standard analog access technology for U.S. cellular applications is advanced mobile phone system (AMPS), which uses a range of frequencies between 824 megahertz (MHz) and 894 MHz. Digital cellular applications typically use frequency division multiple access (FDMA), time division multiple access (TDMA), or code division multiple access (CDMA) access technologies. FDMA systems typically operate between 824 and 893 MHz. TDMA systems normally operate at either 800 MHz (interim standard (IS)-54) or 1900 MHz (IS-136) frequency bands. TDMA technology is implemented in the global system for mobile communications (GSM) standard in three different frequency bands, depending on geography. For example, GSM operates in the 900 MHz and 1800 MHz bands in Europe (EGSM) and Asia, and in the 1900 MHz band in the United States. In addition to GSM, TDMA is used in PCS (personal communication services) based systems operating in the 1850 MHz to 1990 MHz bands. CDMA systems typically operate in either the 800 MHz or 1900 MHz frequency bands.

Given the lack of standardization and the varying infrastructure for the above systems, mobile terminals, such as mobile telephones, personal digital assistants, wireless modems, and the like, often need to communicate in different bands and operate in different modes, depending on the type of transmission technology used. In addition to providing analog capability, newer phones are supporting multiple modes and frequency bands.

To support such operation, mobile terminals typically incorporate dedicated low-noise amplifiers (LNAs) and associated filtering for each frequency band supported. Further, the down-conversion circuitry is configured to down-convert the received signals from various frequency bands, using various transmission technologies, to an intermediate frequency (IF), or directly to a baseband level for baseband processing. The mixers used in the down-conversion circuitry are driven by local oscillators (LOs) having varying frequencies depending on the mode of operation.

Unfortunately, the local oscillator energy can leak into the system and cause a DC offset in the down-converted signal. In some configurations, the local oscillator energy may leak into the antenna, which results in a signal that is amplified by the LNA and mixed into the down-converted signal, resulting in a DC offset. The local oscillator energy may also leak into the LNA inputs, causing the same result. Further, the local oscillator energy may leak into the input of the mixer, and ultimately be mixed with itself to create a DC offset. DC offsets may also be caused by mismatched devices that create an imbalance among differential signals, out-of-band signals from other mobile terminals, out-of-band signals from base stations, and the like.

The DC offset is particularly detrimental in systems wherein the down-converted signals are represented as baseband signals. Even in the absence of leakage signals, the differential signals provided by the down-conversion circuitry should have a common DC level. Typically, DC correction circuitry is used to sample the down-converted differential signals and adjust their DC levels to minimize the impact of any DC offset during baseband processing. For multiple band and multiple mode mobile terminals, switching from one mode or band to another typically affects the DC offsets associated with the differential signals, and requires a DC adjustment of these signals prior to receiving signals in each mode.

During DC offset correction, the antenna must be blocked so that the DC correction circuitry does not falsely lock onto an instantaneous signal level associated with a desired or interfering receive signal. Traditionally, there have been at least two methods to isolate the antenna from the rest of the system. A first method is to use a transmit/receive switch or duplexer to open the path between the LNA and the antenna, and thus avoid any signals being presented to the LNA inputs. This method has proven unacceptable, in that the switch or the duplexer cannot provide complete isolation, and thus allows signals appearing at the antenna to reach the LNA. This results in an almost random DC level at the outputs of the LNAs. A second method is to turn off the LNA, and thus block signals from reaching the down-conversion circuitry. In this method, where the LNA is deactivated, the DC offset correction takes place without compensating for LO leakage. Thus, when the LNA is reactivated, the DC offset caused by leakage signals is present. In essence, the latter method corrects for circuit imperfections, but does not address DC offsets induced by leakage signals. Accordingly, there is a need for an improved architecture and process for addressing and correcting DC offset due to signal leakage and the like.

The assignee of the present invention is also the assignee of U.S. patent application Ser. No. 10/072,361, filed 7 Feb. 2002, now U.S. Pat. No. 6,816,718, which is hereby incorporated by reference in its entirety. The '361 application details one technique to address the DC offset problem using a dummy LNA. However, the use of the dummy LNA may not be optimal in certain situations. Thus, there is a need for an alternate solution.

SUMMARY OF THE INVENTION

The present invention works in a radio frequency receiver adapted to operate using multiple communication technologies. Specifically, the present invention facilitates improved DC offset correction in the radio frequency receiver. In a preferred embodiment, the radio frequency receiver is a multi-mode mobile terminal.

In normal operation, the multi-mode mobile terminal transmits and receives signals through an antenna. An incoming signal arrives at the antenna and passes to a switching module within the mobile terminal. The switching module sends the signal to an appropriate filter within the switching module, and then outputs the signal for routing to an appropriate low noise amplifier (LNA). The choice of the filter and LNA depends on the particular communication technology being used. The signal is amplified by the LNA, down-converted, and then processed at baseband.

In an exemplary embodiment of the present invention, the switching module includes a switch and a filter for each communication technology. The filters may be acoustic filters, such as a surface acoustic wave (SAW) filter. Likewise, the mobile terminal has an LNA for each communication technology. In an exemplary embodiment, the LNAs are positioned within a receiver module along with the down-conversion circuitry. The receiver module is distinct from the switching module.

The down-converted signals typically require DC offset correction so that baseband processing will not be distorted by a DC offset. The present invention provides a technique that helps calculate a desired DC offset correction. Before reception begins, the mobile terminal will know that one of the LNAs will be used to receive and process the incoming signal. This LNA is termed herein the "active LNA." None of the other LNAs will be used to process the incoming signal. These other LNAs are termed herein "unused LNAs." The mobile terminal will use one of the unused LNAs to determine a "default" level DC offset from which a DC offset correction may be determined.

Prior to generating the default level DC offset and calculating the DC offset correction, the active LNA is turned off, and the antenna is decoupled from the receive path leading to the inputs of the LNAs. The control system of the mobile terminal selects one of the unused LNAs and causes a terminating resistance to be activated. The terminating resistance may be positioned at the input of the filter corresponding to the selected unused LNA. Activating the terminating resistance effectively terminates the inputs of the LNA to ground. The selected unused LNA is then turned on. The output of the selected unused LNA provides a default level DC offset that mimics the DC offset that will be generated by the active LNA during normal operation. Based on the default DC offset level, a DC offset correction may be calculated.

In one embodiment, the unused and active LNAs have differential inputs and differential outputs. In the preferred embodiment, the down-conversion circuitry provides quadrature-based down-conversion. Further, the outputs of the down-conversion circuitry are preferably differential in-phase and quadrature-phase intermediate frequency or very low intermediate frequency signals. DC offset correction circuitry is provided to monitor the respective DC levels of the differential in-phase and differential quadrature-phase signals to adjust the DC levels of the respective signals to a substantially common level prior to baseband processing. Although a differential embodiment is preferred, single ended LNA and filter embodiments also benefit from the present invention.

In operation, control logic, such as a central control system, a serial data interface, part of the baseband processing, or a combination thereof may be used to control DC offset correction. The control logic functions to affect DC offset correction as follows. Upon determining the need to receive an incoming signal, the control logic will decouple the antenna from the receive path of all of the LNAs and select an unused LNA from the pool of available unused LNAs. The control logic activates a terminating resistance via a switch, and the output of the selected unused LNA will be provided to the down-conversion circuitry. The down-conversion circuitry will provide an output to the baseband processor with the default level DC offset.

After allowing the system to settle, the control logic instructs the DC offset correction circuitry to correct the DC levels of the respective differential in-phase and differential quadrature-phase signals provided by the down-conversion circuitry. Once the DC offset correction is calculated, the selected unused LNA is deactivated; the terminating resistance is deactivated; and the active LNA is activated. The signal to be received passes from the antenna through the appropriate switch to the SAW filter of the active LNA and then to the LNA. The LNA passes the amplified signal to the down-conversion circuitry, after which the signal is processed at baseband in a traditional fashion using the DC offset correction previously calculated.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 2:
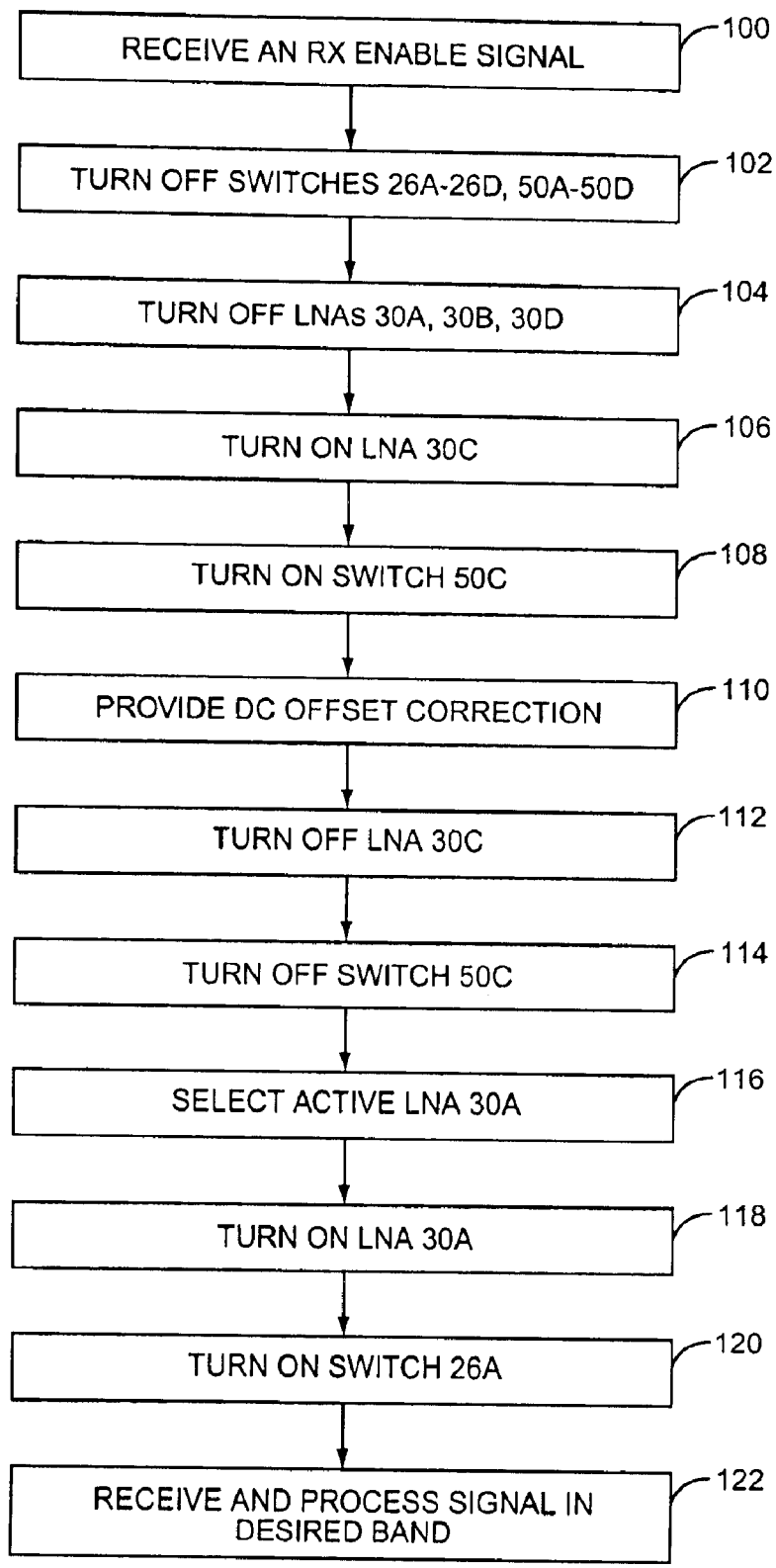

FIG. 1 is a block representation of a mobile terminal configured according to one embodiment of the present invention; and FIG. 2 is a flow diagram outlining a process for DC offset correction according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is designed to facilitate DC offset correction in radio frequency transceivers. To achieve this, an unused low noise amplifier (LNA) has its input terminated to ground and the LNA is temporarily turned on. The resultant signal from the unused LNA is presented to DC offset correction circuitry for creation of an appropriate DC offset. After calculation of the DC offset, the unused LNA is turned off and an active LNA is turned on for reception of incoming signals. While the present invention is particularly well suited for use in mobile terminals such as cellular telephones, other radio frequency transceivers may also benefit from the present invention. The following discussion presents the present invention in the context of a mobile terminal for the sake of explaining an exemplary embodiment.

The basic architecture of a mobile terminal 10 is represented in FIG. 1 and may include a switching module 12, a receiver module 14, a radio frequency transmitter section 16, an antenna 18, a baseband processor (BBP) 20, a control system 22, and user interface 24.

A user may interact with the mobile terminal 10 via the user interface 24, which may include interface circuitry 54 associated with a microphone 56, a speaker 58, a display 60, and a keypad 62. The interface circuitry 54 typically includes analog-to-digital converters, digital-to-analog converters, amplifiers, and the like. Additionally, it may include a voice encoder/decoder, in which case it may communicate directly with the baseband processor 20.

The microphone 56 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 58 by the interface circuitry 54. The display 60 and keypad 62 enable the user to interact with the mobile terminal 10, input numbers to be dialed, and address book information, or the like, as well as monitor call progress information. The use of the user interface 24 is well understood in the art and are not central to the present invention.

The present invention deviates from normal transceiver construction by separating the switching module 12 from the receiver module 14. The switching module 12 includes a plurality of transmit/receive (TX/RX) switches 26, which allow outgoing signals from the transmitter section 16 to be transmitted through the antenna 18 and incoming signals received by the antenna 18 to be processed by the receiving circuitry. The signals transmitted and received are typical information bearing radio frequency (RF) signals and pass to and from one or more remote transmitters provided by an access point, such as a base station (not illustrated).

The illustrated mobile terminal 10 is configured to receive signals from a number of communication bands facilitating a number of communication techniques. During reception of RF signals, the individual TX/RX switches 26A–26D are positioned to connect the antenna 18 to one of a plurality of receive paths, each receive path corresponding to one of the TX/RX switches 26A–26D and containing one of a plurality of filters 28. Each of the filters 28A–28D is connected to a primary low noise amplifier (LNA) 30A–30D within the receiver module 14. Each communication band is associated with a filter from amongst filters 28A–28D and one primary LNA from amongst the illustrated LNAs 30A–30D. As illustrated in the disclosed example, there are four bands corresponding to U.S. Cellular, EGSM, DCS, and PCS. This exemplary configuration is only provided for the purposes of illustration and is not intended to limit the scope of the invention. Filter 28A and LNA 30A operate when receiving signals in the U.S. Cellular band; filter 28B and LNA 30B operate when receiving signals in the EGSM band; filter 28C and LNA 30C operate when receiving signals in the DCS band; and filter 28D and LNA 30D operate when receiving signals in the PCS band. Preferably, the filters 28A–28D are surface acoustic wave (SAW) filters, or compatible filters, having a single ended input and a differential output. The filters 28A–28D provide band-pass filtering for the corresponding communication band to minimize broadband interference and a differential output signal representative of the filtered RF signal.

The differential output signal from the LNAs 30 for the given communication band is then sent to down-conversion circuitry 32, which provides differential quadrature down-conversion in traditional fashion. Accordingly, the differential output signal is down-converted to differential in-phase signals, I+ and I−, and differential quadrature signals, Q+ and Q−, representing the in-phase and quadrature components of the received signal. The in-phase and quadrature signals are down-converted to an intermediate frequency (IF), and preferably a very low IF (VLIF) or direct conversion (DCR), for baseband processing by the baseband processor 20, according to the communication band and technique used when generating the received signal. The baseband processor 20 processes the differential in-phase and quadrature signals, I+, I−, Q+, and Q− to extract the information or data conveyed in the received signal. The down-conversion circuitry 32 typically uses one or more mixing frequencies generated by a frequency synthesizer (not shown) to effect quadrature down-conversion. Since the baseband processing typically comprises demodulation, decoding, and error correction operations, the baseband processor 20 is generally implemented in one or more digital signal processors (DSPs).

On the transmit side, the baseband processor 20 receives digitized data, which may represent voice, data, or control information, either from the user interface 24 or from the control system 22. In either case, the baseband processor 20 encodes the digitized data for transmission. The encoded data is output to the transmitter section 16, where it is used by a modulator 34 to modulate a carrier signal that is at a desired transmit frequency. The modulator 34 also uses one or more mixing frequencies generated by the frequency synthesizer to effect modulation. Power amplifier (PA) circuitry 36 amplifies the modulated carrier signal to a level appropriate for transmission from the antenna 18. The amplified signal is coupled to the antenna 18 via one of the TX/RX switches 26A–26D and an output matching network 38, which provides impedance matching between the power amplifier circuitry 36, the antenna 18, and TX/RX switches 26A–26D.

The present invention is directed to an improved structure and technique for addressing DC offset within the differential in-phase signals I+ and I−, and the DC offset between the differential quadrature signals Q+ and Q− when transitioning to a receive state for any communication band. Accordingly, the following outlines the general techniques for compensating for such DC offsets and will be followed by a detailed discussion of how to use an unused LNA 30 to minimize DC offsets associated with leakage from the local oscillator in the frequency synthesizer.

Prior to baseband processing, the differential in-phase and quadrature signals I+, I−, Q+ and Q− are preferably filtered with filters 40A–40D, respectively, and amplified with amplifiers 42A and 42B to a desired signal level. As illustrated, the relative DC levels of each of the differential in-phase and quadrature signals I+, I−, Q+, and Q− are monitored by DC correction circuitry 44. The DC correction circuitry 44 determines the relative DC levels for the differential in-phase and quadrature signals I+, I−, Q+, and Q−, and provides corresponding level adjustment outputs to adjust the DC levels of the individual differential in-phase and quadrature signals I+, I−, Q+, and Q− (i.e., the DC offset correction). Each level adjustment output is summed with the corresponding one of the differential in-phase and quadrature signals, I+, I−, Q+, and Q− to effect DC offset correction using summing circuitry 46A–46D. The DC offset correction operates to force the DC levels of the differential in-phase signals I+ and I− to a first common level, and the DC levels of the differential quadrature signals Q+ and Q− to a second common level to reduce or eliminate distortion caused by having a DC offset between the respective differential signals. The first and second common levels may be the same or different as needed or desired.

While differential DC offset correction is illustrated, it should be appreciated that the present invention is equally applicable to the outputs of single-ended LNAs. DC offset correction according to the present invention is readily adapted to such single-ended LNAs. Such single-ended LNAs may be preceded by single-ended SAWs as needed or desired.

The present invention capitalizes on the fact that only one of the plurality of LNAs 30 will be active during normal reception. This situation leaves one or more LNAs 30 unused. Prior to normal reception, one of the unused LNAs 30 may be used to establish a default level DC offset from which a DC offset correction may be calculated. To help effectuate this, each of the filters 28A–28D is connected to a corresponding terminating resistance 48A–48D. While illustrated and described herein as "resistances," it should be appreciated that these resistances may be impedances formed from any combination of real and reactive components. The terminating resistances 48A–48D are activated by corresponding switches 50A–50D, also termed herein "resistance terminating switches." When activated, a terminating resistance 48 acts to create a closed circuit between the input of the corresponding filter 28 and ground. By creating this closed circuit, the inputs of the corresponding LNA 30 are likewise terminated to ground. The leakage from the local oscillator then enters the closed circuit and is presented to the corresponding filter 28. While the present invention preferably incorporates the TX/RX switches 26, the filters 28, the terminating resistances 48A–48D and the switches 50A–50D into the switching module 12 and the LNAs 30, the down-conversion circuitry 32, and the serial data interface 52 into the receiver module 14, other arrangements are also possible.

For controlling DC offset correction according to the disclosed embodiment, control logic, represented by the control system 22, controls the TX/RX switches 26, the operational state of the LNAs 30, and the switches 50A–50D via the serial data interface 52, and directly controls the DC correction circuitry 44. Note that the control system 22 may directly control the switches 26, 50A–50D and the LNAs 30 if needed or desired.

With this structural background, it is possible to explicate how the present invention works. The DC offset correction process for the disclosed embodiment of the present invention is outlined in FIG. 2. FIG. 2 assumes that the mobile terminal 10 is operating in a U.S. Cellular network. Because the mobile terminal 10 is operating in the U.S. Cellular network, the mobile terminal 10 does not need to use the circuitry for the other communication technologies. Specifically, filters 28B–28D and LNAs 30B–30D are not needed during normal operation. In this situation, LNA 30A is "active," and LNAs 30B–30D are "unused."

The mobile terminal 10 receives a receive (RX) enable signal (block 100). The control system 22, by way of serial data interface 52, turns off the switches 26A–26D and 50A–50D (block 102). The control system 22 selects one of the unused LNAs 30 to use for the DC offset correction. In this example, the control system selects unused LNA 30C. The control system 22, again by way of the serial data interface 52, then turns off the active LNA 30A, as well as the unused LNAs 30B, and 30D (block 104). The selected unused LNA 30C is then turned on (block 106). The control system 22, by way of the serial data interface 52, then turns on the switch 50C to connect the terminating resistance 48C for LNA 30C (block 108).

With the LNA 30C on and the terminating resistance 48C connected, the inputs of LNA 30C are terminated to ground, and a signal arrives from the LNA 30C at the down-conversion circuitry 32. The down-conversion circuitry 32 down-converts and outputs the down-converter signal. This down-converter signal contains only a default level DC offset. This default level DC offset comes from the leakage signals from the local oscillators in the frequency synthesizer or other sources as previously explained. This default level DC offset provides the basis from which a DC offset correction can be and is calculated (block 110) by DC offset correction circuitry 44. Specifically, the control system 22 activates the DC correction circuitry 44, which calculates the needed offset as previously explained.

After the DC offset correction is calculated, the control system 22, by way of the serial data interface 52, turns off the unused LNA 30C (block 112) and the switch 50C (block 114). The control system 22 then selects, via the serial data interface 52, the active LNA 30A (block 116). The control system 22, by way of the serial data interface 52, turns on the active LNA 30A (block 118) and the switch 26A (block 120). With the proper LNA 30 and switch 26 turned on, the mobile terminal 10 may receive and process the incoming signal from a base station in the desired band (block 122) using the DC offset correction that has been previously calculated.

It should be appreciated that any of the "unused" LNAs 30 may be used during the DC offset calculation period, and that it need not be a particular unused LNA 30. Likewise, one of ordinary skill in the art will readily appreciate that the same technique can be used to calculate DC offsets for the PCS, DCS, and EGSM communication technologies by picking an appropriate unused LNA 30 and terminating resistance 48. Further, while the mobile terminal 10 has been illustrated as a quad-band mobile terminal, it should be appreciated that the present invention is suitable for use in multi-mode cellular telephones having two, three, four, or more modes.

Further, various aspects of the control system 22 and the baseband processor 20 may be integrated in various degrees. Additional information relating to receiver front ends, LNAs, and down-conversion technology may be found in *RF Microelectronics*, by Behzad Razavi, 1998, which is incorporated herein by reference in its entirety.

Those skilled in the art will recognize improvements and modifications to the preferred embodiments of the present invention. For example, the communication bands represented in the above embodiment may vary in number and type. Further, the LNAs may have a single ended input (non-differential), single ended output, or a combination thereof. All such improvements and modifications are considered within the scope of the concepts disclosed herein and the claims that follow.

What is claimed is:

1. Circuitry facilitating improved DC offset correction comprising:
   a plurality of low noise amplifiers (LNAs);
   a plurality of terminating impedances, each of said plurality of terminating impedances corresponding to a different one of said plurality of LNAs; and
   a control system adapted to:
      determine an active LNA from amongst the plurality of LNAs;
      turn off the active LNA;
      select an unused LNA from amongst the plurality of LNAs;
      turn on the selected unused LNA; and
      terminate an input of the selected unused LNA to ground with one of said plurality of terminating impedances while a DC offset is determined and a DC offset correction is calculated.

2. The circuitry of claim 1 further comprising a plurality of filters, each of said plurality of filters associated with different ones of said plurality of LNAs.

3. The circuitry of claim 2 wherein each of said terminating impedances selectively links an input of a corresponding one of said plurality of filters to ground, thereby terminating the input of the selected unused LNA to ground.

4. The circuitry of claim 1 further comprising a plurality of switches, each of said plurality of switches corresponding to different ones of said plurality of LNAs.

5. The circuitry of claim 4 wherein said plurality of switches comprises a plurality of transmit/receive switches.

6. The circuitry of claim 4 wherein said plurality of switches comprises a plurality of switches adapted to activate said plurality of terminating impedances.

7. The circuitry of claim 1 further comprising a first plurality of switches, each of said first plurality of switches corresponding to different ones of said LNAs; and a second plurality of switches, each of said second plurality of switches corresponding to different ones of said LNAs.

8. The circuitry of claim 7 wherein said first plurality of switches comprises a plurality of transmit/receive switches and said second plurality of switches comprises a plurality of switches adapted to activate said plurality of terminating impedances.

9. The circuitry of 1 further comprising DC offset correction calculation circuitry adapted to determine the DC offset and calculate the DC offset correction, said DC offset correction calculation circuitry operatively connected to said plurality of LNAs.

10. The circuitry of claim 1 further comprising a serial data interface adapted to operate in conjunction with said control system and turn on and turn off LNAs.

11. A method of performing DC offset correction, comprising:
    turning off an active low noise amplifier (LNA);
    turning on an unused LNA;
    terminating a input associated with the unused LNA with a terminating impedance;
    determining a DC offset; and
    calculating a DC offset correction.

12. The method of claim 11 further comprising decoupling an antenna from the active LNA and the unused LNA.

13. The method of claim 11 further comprising using a filter with the unused LNA.

14. The method of claim 13 wherein using a filter comprises using a surface acoustic wave filter.

15. The method of claim 11 wherein turning on an unused LNA comprises using a serial data interface to turn on the unused LNA.

16. The method of claim 11 further comprising turning off the unused LNA and turning on an active LNA subsequent to calculating a DC offset correction.

17. The method of claim 11 wherein terminating an impedance associated with the unused LNA comprises activating a switch that couples to a resistor.

18. The method of claim 11 wherein turning off the active LNA comprises opening a switch.

19. The method of claim 11 wherein said method operates in a multi-mode mobile terminal.

20. The method of claim 11 further comprising providing the DC offset correction for correcting a DC offset output from the active LNA.

21. The method of claim 11 further comprising using the DC offset correction upon an incoming signal operated on by the active LNA.

22. A multi-mode mobile terminal comprising:
    an antenna adapted to send and receive signals;
    a switching module comprising:
        a plurality of transmit/receive switches, said plurality of transmit/receive switches corresponding to a number of modes available to said multi-mode mobile terminal;
        a plurality of filters, each of said filters associated with a corresponding one of said transmit/receive switches;
        a plurality of terminating impedances, each of said filters associated with a corresponding one of said terminating impedances; and
        a plurality of impedance terminating switches, each of said impedance terminating switches associated with a corresponding one of said terminating impedances;
    DC offset correction circuitry adapted to determine a DC offset and calculate a DC offset correction;
    receiver circuitry comprising:
        a plurality of low noise amplifiers (LNAs), each of said LNAs associated with one of said filters; and
    a control system adapted to:
        turn on an unused LNA within said plurality of LNAs;
        turn off an active LNA within said plurality of LNAs;
        close the impedance terminating switch associated with the unused LNA so as to connect an input of the corresponding LNA to ground; and
        control the DC offset correction circuitry.

23. A switching module comprising:
    a plurality of switches adapted to couple and decouple an antenna to transmit and receive paths associated with a radio frequency transceiver;
    a plurality of filters, each of said filters associated with different ones of said plurality of switches, each of said filters adapted to output a signal to a low noise amplifier (LNA) in a receiver module;
    said switching module a distinct module adapted to be placed in a mobile terminal; and
    a plurality of terminating impedances, each of said terminating impedances connected to a different one of said plurality of filters via a terminating switch.

24. The switching module of claim 23 wherein each of said plurality of filters is a surface acoustic wave filter.

25. The switching of claim 23 wherein each of said plurality of switches is adapted to be controlled by a control system within the mobile terminal.

\* \* \* \* \*